(12) United States Patent
Yoneda (10) Patent No.: US 6,229,711 B1
(45) Date of Patent: May 8, 2001

(54) FLIP-CHIP MOUNT BOARD AND FLIP-CHIP MOUNT STRUCTURE WITH IMPROVED MOUNTING RELIABILITY

(75) Inventor: Yoshihiro Yoneda, Kawasaki (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 09/257,035

(22) Filed: Feb. 25, 1999

(30) Foreign Application Priority Data

Aug. 31, 1998 (JP) .................................................. 10-246225

(51) Int. Cl.⁷ ............................................................ H05K 7/02
(52) U.S. Cl. ........................... 361/760; 361/767; 361/807; 361/808; 257/778; 257/780; 257/737; 257/738; 174/52.1; 174/52.2; 174/259; 174/260; 174/262
(58) Field of Search ................................... 361/760, 765, 361/767, 748, 807, 808; 257/778, 779, 780, 737, 738, 739; 174/52.2, 52.1, 259, 260, 262, 253, 254; 228/180.22

(56) References Cited

U.S. PATENT DOCUMENTS

| | | | |
|---|---|---|---|
| 4,413,309 | * | 11/1983 | Takahashi et al. .................... 361/774 |
| 5,400,950 | * | 3/1995 | Myers et al. ..................... 228/180.22 |
| 5,428,505 | * | 6/1995 | Sakemi et al. ......................... 361/777 |
| 5,477,933 | * | 12/1995 | Nguyen ................................. 174/262 |
| 5,517,756 | * | 5/1996 | Shirai et al. ............................. 29/847 |
| 5,528,001 | * | 6/1996 | Roberts ................................. 174/268 |
| 5,535,101 | * | 7/1996 | Miles et al. ........................... 367/808 |
| 5,547,740 | * | 8/1996 | Higdon et al. ........................ 428/209 |
| 5,611,481 | * | 3/1997 | Akamaatsu et al. ............. 228/180.22 |
| 5,615,477 | * | 4/1997 | Sweitzer ................................. 29/840 |
| 5,878,942 | * | 3/1999 | Kodama et al. ................. 228/180.22 |
| 5,973,404 | * | 10/1999 | Akram et al. ......................... 257/778 |

FOREIGN PATENT DOCUMENTS

354161269A * 12/1979 (JP) ................................ H01L/23/50

* cited by examiner

Primary Examiner—Jeffrey Gaffin
Assistant Examiner—David Foster
(74) Attorney, Agent, or Firm—Staas & Halsey LLP (57) ABSTRACT

A flip-chip mount board includes a circuit board provided with a plurality of conductor patterns to which a plurality of bumps provided on an electronic component can be connected via a connection medium provided on the conductor patterns. The conductor pattern includes at least one wiring pattern and a connection pad, the wiring pattern serves as an interconnection, the connection pad is provided at a position corresponding to one of the bumps, the at least one wiring pattern and the connection pad are provided in an integrated manner, and a width (W1) of the connection pad is formed so as to be greater than a width (W2) of the wiring pattern (W1>W2).

20 Claims, 9 Drawing Sheets

FLIP-CHIP MOUNT BOARD AND FLIP-CHIP MOUNT STRUCTURE WITH IMPROVED MOUNTING RELIABILITY

BACKGROUND OF THE INVENTION

1. Field of the Invention

The present invention generally relates to a flip-chip mount board and a flip-chip mount structure, and particularly relates to a flip-chip mount board provided with a plurality of conductor patterns to which a plurality of bumps provided on an electronic component can be connected via a connection medium provided on the conductor patterns.

2. Description of the Related Art

Recently, there is an improvement in the density of electronic components such as semiconductor chips. Accordingly, finer pitch is required for external connection terminals, such as bumps, provided on electronic components.

Therefore, as for a mount board, it is necessary to provide connection pads at a considerably high density. The mount board, to which the above-described electronic components are to be mounted, is hereinafter referred to as a flip-chip mount board. Also, a high reliability is required when flip-chip mounting the electronic components.

Now, a flip-chip mounting process of an electronic component, e. g., a semiconductor chip, onto a flip-chip mount board will be described. First of all, connection part conductor patterns (hereinafter referred to as conductor patterns) are formed on the flip-chip mount board. Then, the conductor patterns are provided with solder serving as a connection medium. Finally, the flip-chip mounting process is completed by connecting the bumps (e.g., gold bumps) provided on the semiconductor chip to the conductor patterns.

Figure 1:
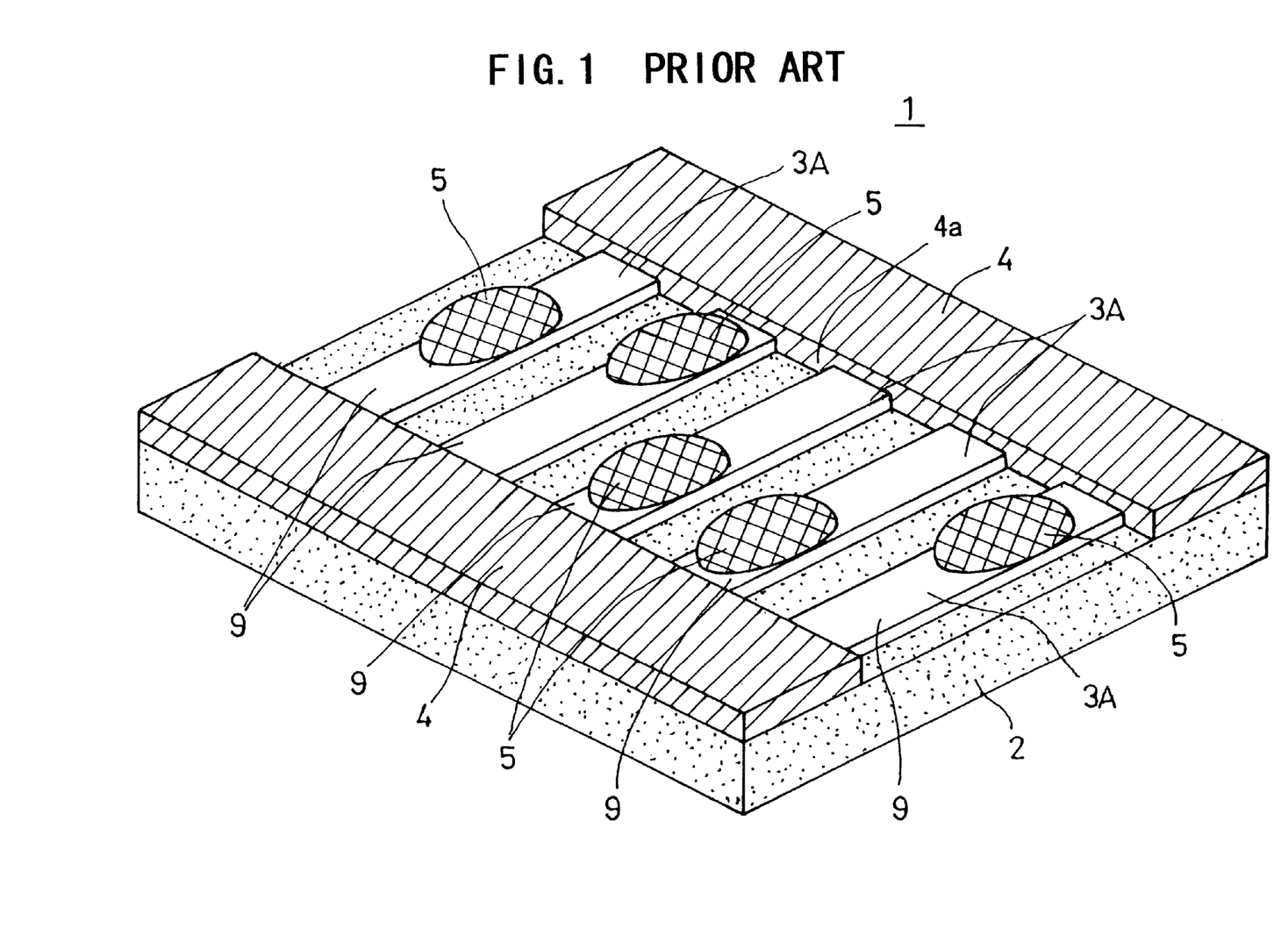
FIG. 1 is a perspective diagram showing a part of a flip-chip mount board of the related art.
Figure 2:
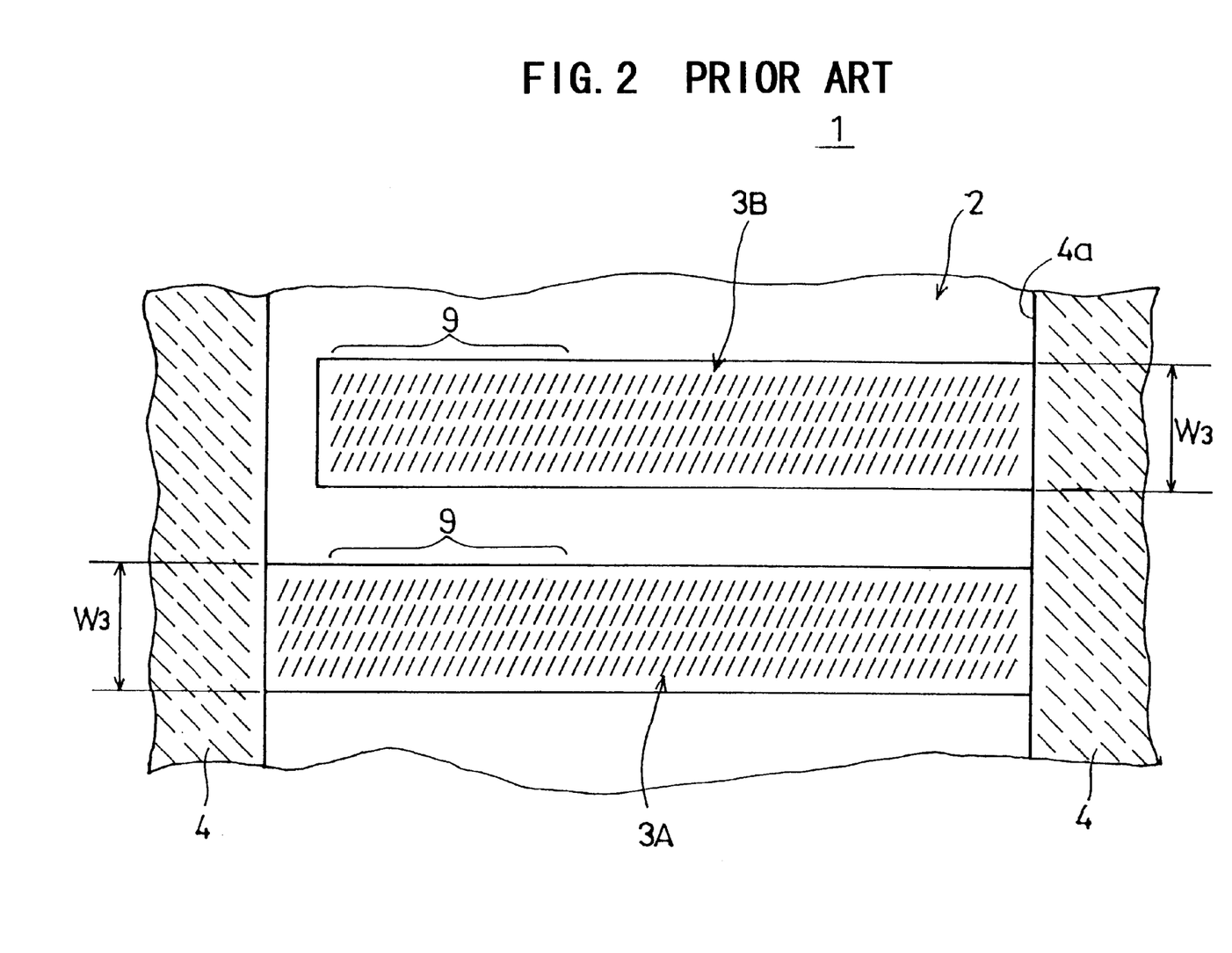
FIG. 2 is a plan view showing a part of a flip-chip mount board of the related art.

FIGS. 1 and 2 are an enlarged perspective diagram and a plan view, respectively, partially showing a flip-chip mount board 1. As shown in FIGS. 1 and 2, the flip-chip mount board 1 includes a circuit board 2, conductor patterns 3A, 3B, a solder resist 4 and solder lumps 5.

Figure 3:
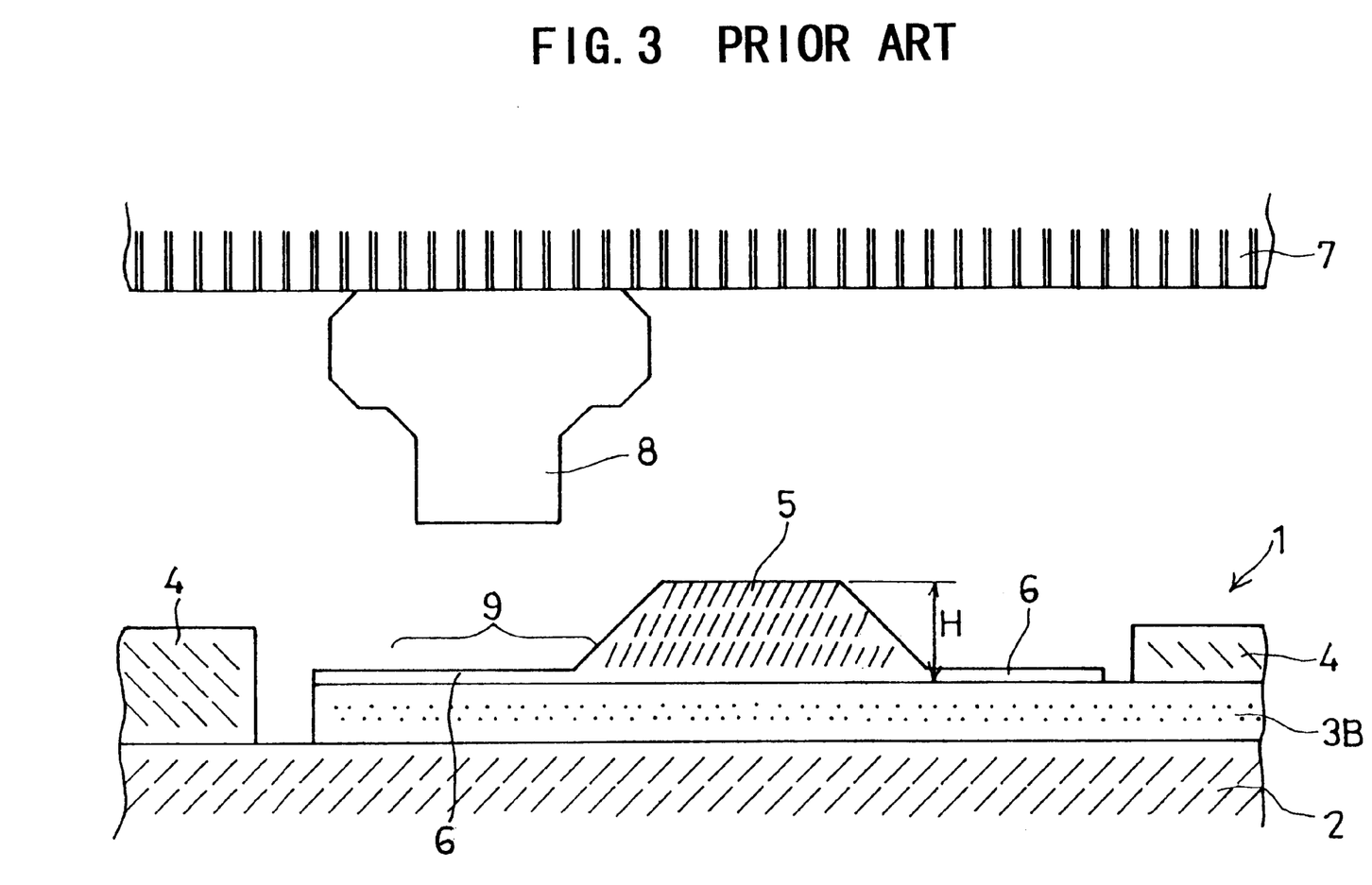
FIG. 3 is a diagram showing a positioning of a semiconductor chip to be mounted onto the flip-chip mount board of the related art.

The conductor patterns 3A, 3B are provided on an upper surface of the circuit board 2 so as to form a predetermined pattern. As shown in FIG. 3, a bump 8 made of gold, for example, provided on a semiconductor chip 7 may be connected to a part of the conductor pattern 3A, 3B. Hereinafter, a part of the conductor pattern 3A, 3B, to which part the gold bump 8 is to be connected, will be referred to as a connection pad 9.

Now, the width of the connection pad 9 will be described in detail. As shown in FIG. 2, the conductor pattern 3A, 3B including the connection pad 9 has a uniform width W3 along the whole length. The width W3 is approximately 30 to 60 μm.

Also, the solder resist 4 serving as an insulator is provided over the circuit board 2, except for positions over the conductor patterns 3A, 3B to which positions the semiconductor chip 7 may connected.

In other words, the solder resist 4 is provided with an opening 4a at a position where the semiconductor chip 7 and the conductor patterns 3A, 3b are connected. The gold bumps 8 will be connected to the parts of the conductor patterns 3A, 3B exposed by the opening 4a. Therefore, the remaining parts of the conductor patterns 3A, 3B are covered, and thus protected, by the solder resist 4.

As shown in FIG. 2, the conductor pattern 3A is covered by the solder resist 4 on both ends. The conductor pattern 3B is covered by the solder resist 4 on one end. The other end of the conductor pattern 3B terminates before reaching the solder resist 4.

Generally, in order to mount a semiconductor chip securely on a flip-chip mount board, it is necessary to provide a solder layer having a uniform thickness onto connection pads. In order to achieve a uniform thickness, it is advantageous to increase an area of the connecting pad because the total number of solder particles provided on the connection pad will be also be increased. In other words, unwanted effects due to the variation in the number of solder particles provided on the connection pad can be reduced.

However, when the area of the connection pads is comparatively large, the solder lump 5 may be created when solder particles are coated on the surface of the conductor patterns 3A, 3B with flux, and then fused. This is because a surface tension is produced in the fused solder, which is in a liquid state. The solder lump 5 thus formed on the conductor pattern 3A, 3B has a height H of approximately 20 to 40 μm. The solder lump 5 serves so as to electrically and mechanically connect the gold bump 8 and the conductor pattern 3A, 3B.

It is also noted that with a recent semiconductor chip having a high-density structure, the pitch between the gold bumps is comparatively fine. Thereby, the width of the connection pad, i.e., the conductor pattern, is also reduced.

Accordingly, in order to increase the area of the connection pad while reducing the width thereof, it is necessary to increase the length of the connection pad. In the related art, since the width of the connection pad is equal to the width of the conductor pattern, increasing the length of the connection pad is equivalent to increasing the length of the conductor pattern.

However, when the width of the connection pad, or the conductor pattern is reduced while increasing the length thereof, a uniform solder layer cannot be obtained since solder lumps will be produced at irregular positions. For example, the connection pad has a width of less than 60 μm and a length of more than 300 μm, and it is attempted to form a uniform solder layer having a thickness of approximately 10 to 20 μm. In such case, a uniform solder layer can not be obtained, since, as shown in FIG. 1, the solder lumps 5 will be formed on the conductor patterns 3A, 3B at irregular positions.

Since the solder lumps 5 are provided at irregular positions, positions of the connection pads 9 and positions of the solder lumps 5 will not correspond to each other. Therefore, as shown in FIG. 3, when the semiconductor chip 7 is positioned above the flip-chip mount board 1, the positions of gold bumps 8 and the solder lumps 5 will not correspond to each other.

Figure 4:
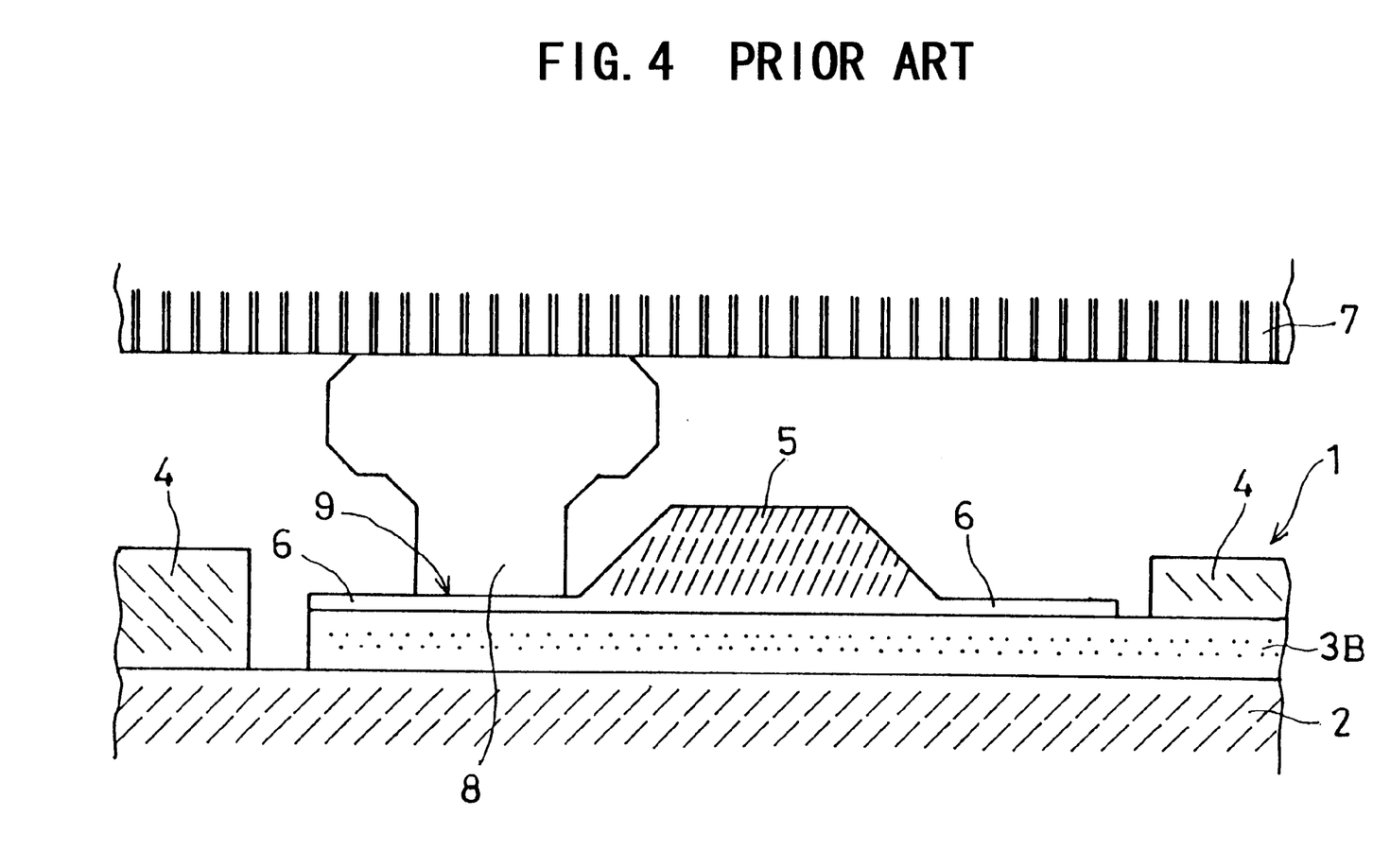
FIG. 4 is a diagram showing a mounted state of the semiconductor chip on the flip-chip mount board of the related art.

It is only solder films 6 that are provided at the positions corresponding to the gold bumps 8. FIG. 4 shows a state where the semiconductor chip 7 is mounted on the flip-chip mount board 1. In this state, the solder films 6 do not provide a sufficient joining force between the gold bumps 8 and the connection pads 9. Therefore, there is a need for a mount board which has a higher mounting reliability.

SUMMARY OF THE INVENTION

Accordingly, it is a general object of the present invention to provide a flip-chip mount board and a flip-chip mount structure which satisfy the needs described above.

It is another and more specific object of the invention to provide a flip-chip mount board which can achieve a highly reliable connection between bumps provided on an electronic component and connection pads provided on the flip-chip mount board via a connection medium.

In order to achieve the above object, a conductor pattern comprises at least one wiring pattern and a connection pad, the wiring pattern serving as an interconnection, the connection pad being provided at a position corresponding to one of bumps, the at least one wiring pattern and the connection pad being provided in an integrated manner, and a width (W1) of the connection pad being formed so as to be greater than a width (W2) of the wiring pattern (W1>W2).

With the flip-chip mount board described above, the connection medium is always gathered on the connection pad and forms a connection medium lump at a position corresponding to the bump, i.e., on the connection pad. Also, the connection medium may be solder. The circuit board may be a printed-circuit board. The insulating layer may be a solder resist. The electronic component may be a semiconductor chip. Also, the bumps provided on the connection pad may primarily be made of a material having gold (Au).

It is yet another object of the invention to provide a flip-chip mounting board which can form connection medium lumps on connection pads with an improved reliability.

In order to achieve the above object, the connection pad has a shape of an elongated rectangle and the wiring pattern has a shape formed by a single or a plurality of rectangles.

A ratio (W1/L1) between the width W1 of the connection pad and a length L1 of the connection pad satisfies the relationship:

$$0.2 \leq (W1/L1) \leq 0.5,$$

and, a ratio (W2/L2) between the width W2 of the wiring pattern and the length L2 of the wiring pattern satisfies the relationship:

$$0.1 \leq (W2/L2) \leq 2.0.$$

Also, a difference between the width (W1) of the connection pad and the width (W2) of the wiring pattern (W1−W2) is 10 to 30 μm.

It is yet another object of the invention to provided a flip-chip mount board wherein parts of the conductor pattern, where the electronic component is not connected to, are prevented from being damaged, thus further improving the reliability of the flip-chip mount board.

In order to achieve the above object, the circuit board is provided with an insulating layer except at positions contributing to the mounting of the electronic component. The insulating layer may serve as a dam portion for preventing the insulating layer from being spread.

It is yet another object of the invention to provide a flip-chip mount board which can be adapted to a high-density electronic component.

In order to achieve the above object, the connection pads are provided at positions corresponding to a peripheral part of the electronic component, and have a pitch between 70 μm and 120 μm.

It is yet another object of the invention to provide a flip-chip mount board which can achieve a higher reliability.

In order to achieve the above object, the bumps are stud bumps subjected to a leveling operation so as to have a uniform height.

It is yet another object of the invention to provide a flip-chip mount structure which can improve a mounting reliability.

In order to achieve the above object, an under-fill resin is provided between the flip-chip mount board and the electronic component.

Other objects and further features of the present invention will be apparent from the following detailed description when read in conjunction with the accompanying drawings.

DETAILED DESCRIPTION OF THE PREFERRED EMBODIMENTS

In the following, principles and embodiments of the present invention will be described with reference to the accompanying drawings.

Figure 5:
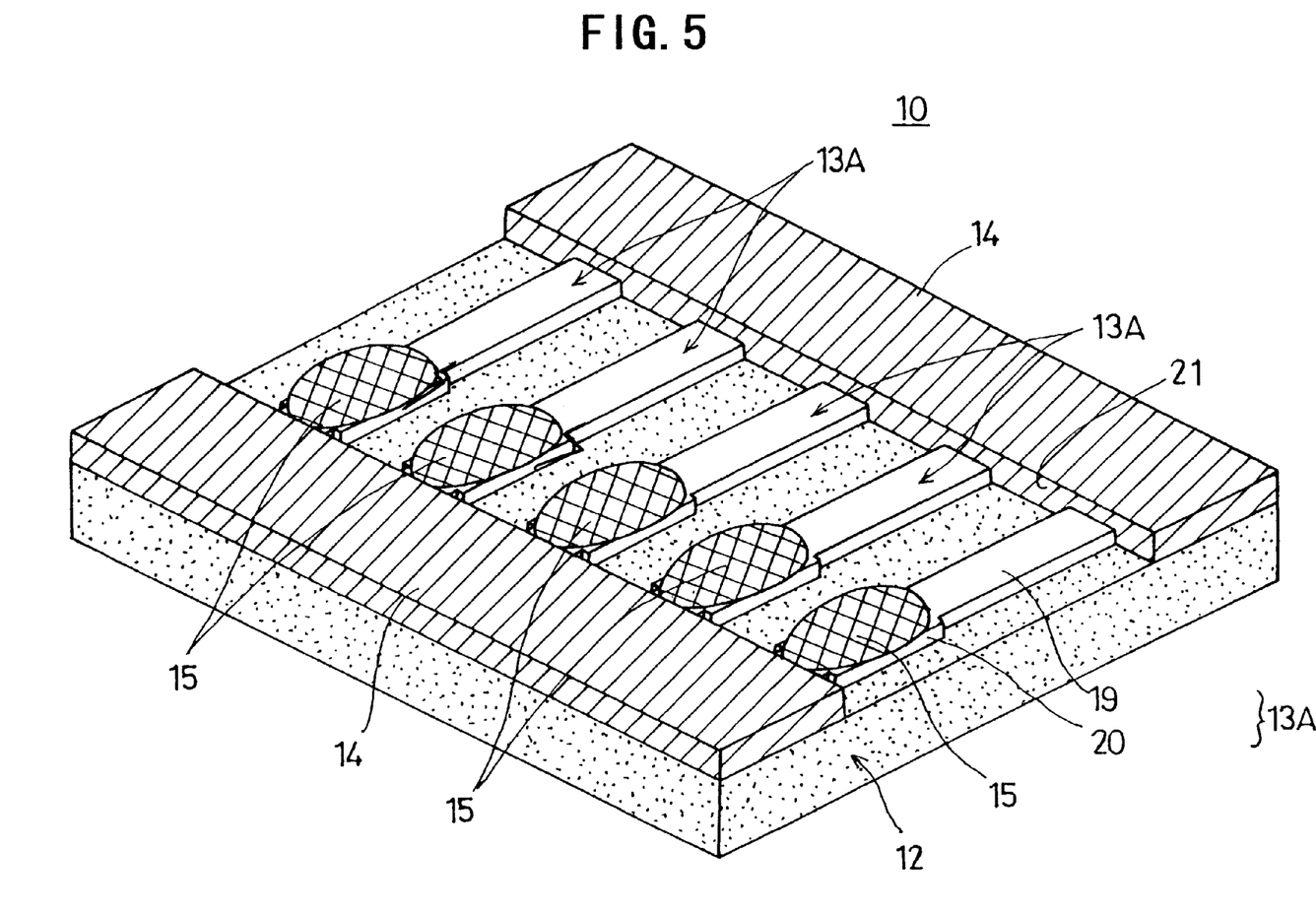
FIG. 5 is a perspective diagram showing a part of a flip-chip mount board of the present invention.
Figure 6:
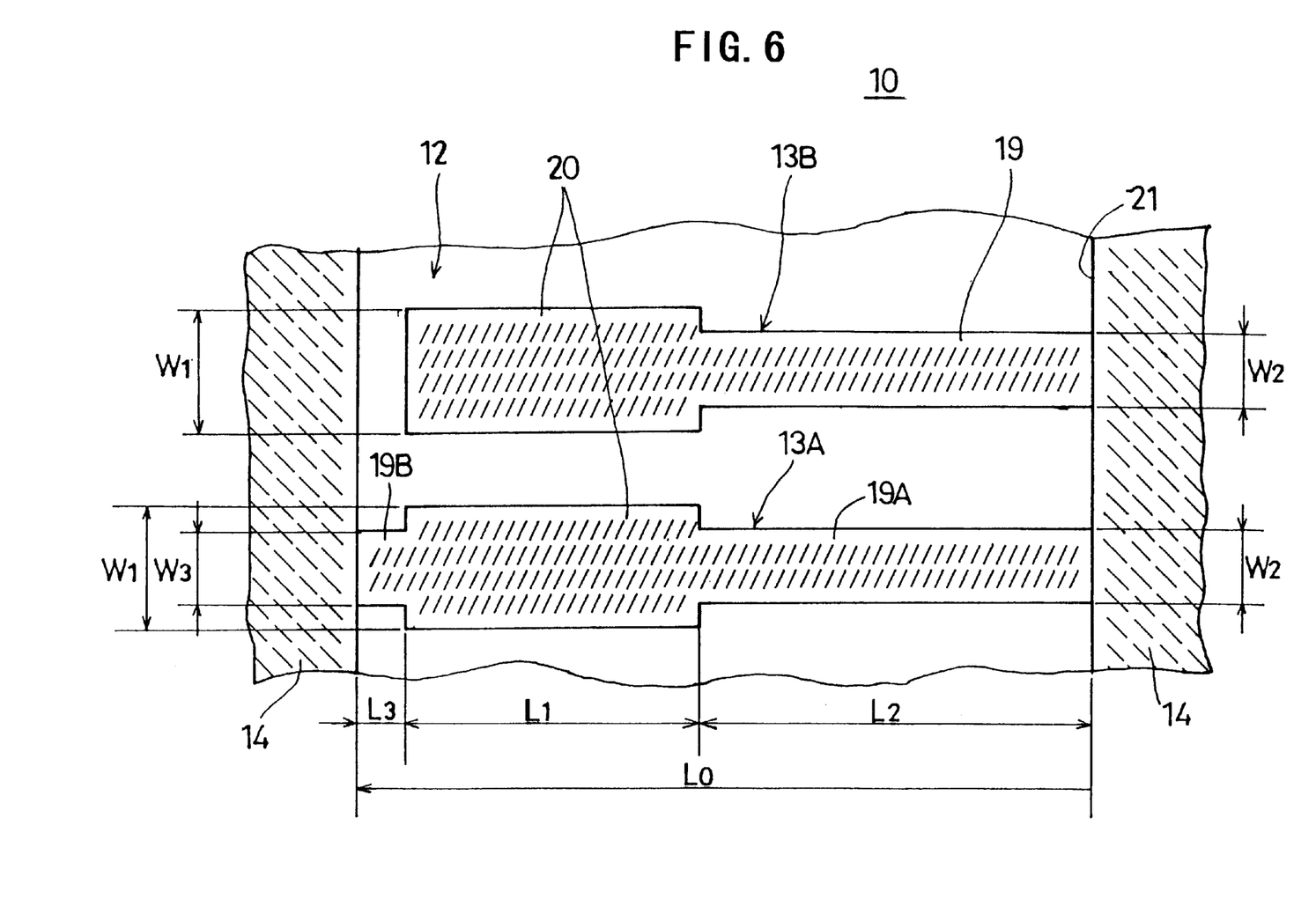
FIG. 6 is a plan view showing a part of a flip-chip mount board of an embodiment of the present invention.

Referring to FIGS. 5 and 6, a flip-chip mount board 10 will be described. FIG. 5 is a perspective diagram showing a part of a flip-chip mount board of the present invention. FIG. 6 is a plan view showing a part of a flip-chip mount board of an embodiment of the present invention.

As partially shown in FIGS. 5 and 6, the flip-chip mount board 10 includes a circuit board 12, conductor patterns 13A, 13B, a solder resist 14 and solder lumps 15.

The circuit board 12 is, for example, a printed-circuit board, and is provided with the conductor patterns 13A, 13B on its upper surface. The conductor patterns 13A, 13B made of copper, for example, are patterned according to a predetermined pattern by a technique such as an etching method.

Each of the conductor patterns 13A, 13B is formed by a wiring pattern 19, 19A, 19B serving as an interconnection, and a connection pad 20 provided at a position corresponding to a bump 18 provided on a semiconductor chip 17. The wiring pattern 19, 19A, 19B and the connection pad 20 are provided in an integrated manner. Physical dimensions of the wiring pattern 19, 19A, 19B and the connection pad 20 will be described later.

The solder resist 14 serving as an insulator is provided over the circuit board 12, expect for positions over the conductor patterns 13A, 13B to which positions the semiconductor chip 17 is to be connected.

In other words, the solder resist 14 is provided with an opening 21 at a position where the semiconductor chip 17 and the conductor patterns 13A, 13b are connected. The bumps 18 will be connected to the part of the conductor patterns 13A, 13B exposed from the opening 21. The above-described wiring patterns 19, 19A, 19B and the connection pads 20 are provided in the opening 21. The remaining parts of the conductor patterns 13A, 13B are covered, and thus protected, by the solder resist 14.

As shown in FIG. 6, the conductor pattern 13A is covered by the solder resist 14 on both ends. In the present embodiment shown in the figure, the connection pad 20 is provided with the wiring pattern 19A provided on its right-hand side and the wiring pattern 19B provided on its left-hand side. The conductor pattern 13B is covered by the solder resist 14 on one end. The other end of the conductor pattern 13B terminates before reaching the solder resist 14.

The solder lump 15 is provided for electrically and mechanically connecting the bump 18 and the conductor pattern 13A, 13B. The height H of the solder lump 15 is, though dependent on the conditions at which the solder layer was formed, preferably approximately 20 to 40 $\mu$m.

Now, referring to FIG. 6, the physical dimensions of the conductor patterns 13A, 13 will be described in detail.

The connection pad 20 has a width W1 of approximately 30 to 60 $\mu$m and a length L1 of approximately 200 to 300 $\mu$m. The wiring patterns 19, 19A, 19B have widths W2, W3 of approximately 20 to 50 $\mu$m. The difference between the width W1 of the connection pad 20 and the widths W2, W3 of the wiring patterns 19, 19A, 19B (W1−W2 or W1−W3) is approximately 10 to 30 $\mu$m.

In other words, the flip-chip mount board 10 of the present embodiment is constructed such that the width W1 of the connection pad 20 is greater than the widths W2, W3 of the wiring patterns 19, 19A, 19B.

Further, configurations of the connection pad 20 and the wiring patterns 19, 19A, 19B of the conductor patterns 13A, 13B will be described in detail.

The conductor pattern 13A is provided with a plurality of, in the present embodiment, two, wiring patterns 19A, 19B, each of which has a rectangular shape (in FIG. 6, an elongated rectangular shape). Also, the conductor pattern 13B is provided with one wiring pattern 19, which also has a rectangular shape (in FIG. 6, an elongated rectangular shape). Further, each of the connection pads 20 has an elongated rectangular shape.

Now, the connection pad 20 having an elongated rectangular shape is considered, particularly in regards to a relationship between the width W1 and the length L1. In the present embodiment, a ratio (W1/L1) of the width W1 to the length L1 satisfies the relationship:

$$0.2 \leq (W1/L1) \leq 0.5.$$

Next, the wiring patterns 19, 19A, 19B having a rectangular shape are considered, particularly in regards to a relationship between the widths W2, W3 and the lengths L2, L3. In the present embodiment, ratios (W2/L2) and (W3/L3) of the widths W2, W3 to the lengths L2, L3, respectively, satisfy the relationships:

$$0.1 \leq (W2/L2) \leq 2.0$$

and $$0.1 \leq (W3/L3) \leq 2.0.$$

Note that in the above description, the connection pad 20 is limited to an elongated rectangular shape, whereas each of the wiring patterns 19, 19A, 19B have rectangular shapes. This is because the wiring patterns 19, 19A, 19B may include square shapes, in which case:

$$(W2/L2)=1$$

and/or $$(W3/L3)=1.$$

The effect of providing the width W1 of the connection pad 20 to be greater than the width W2 of the wiring pattern 19, 19A, 19B, i.e., W1>W2, is as follows. When the solder particles provided on the conductor pattern 13A, 13B are fused, the fused solder will be gathered on the connection pad 20 and forms a solder lump 15. There will only be a thin layer of solder, i.e., solder film 16, provided on each of the wiring patterns 19, 19A, 19B.

The above effect is particularly notable when the ratio (W1/L1) between the width W1 and the length L1 of the connection pad 20 satisfies the relationship:

$$0.2 \leq (W1/L1) \leq 0.5,$$

and the ratios (W2/L2) and (W3/L3) of the widths W2, W3 to the lengths L2, L3, respectively, satisfy the relationships:

$$0.1 \leq (W2/L2) \leq 2.0$$

and $$0.1 \leq (W3/L3) \leq 2.0.$$

Therefore, when these conditions are satisfied for the connection pad 20 and the wiring patterns 19, 19A, 19B, the solder lumps 15 will always be provided on the connection pad 20.

Figure 7:
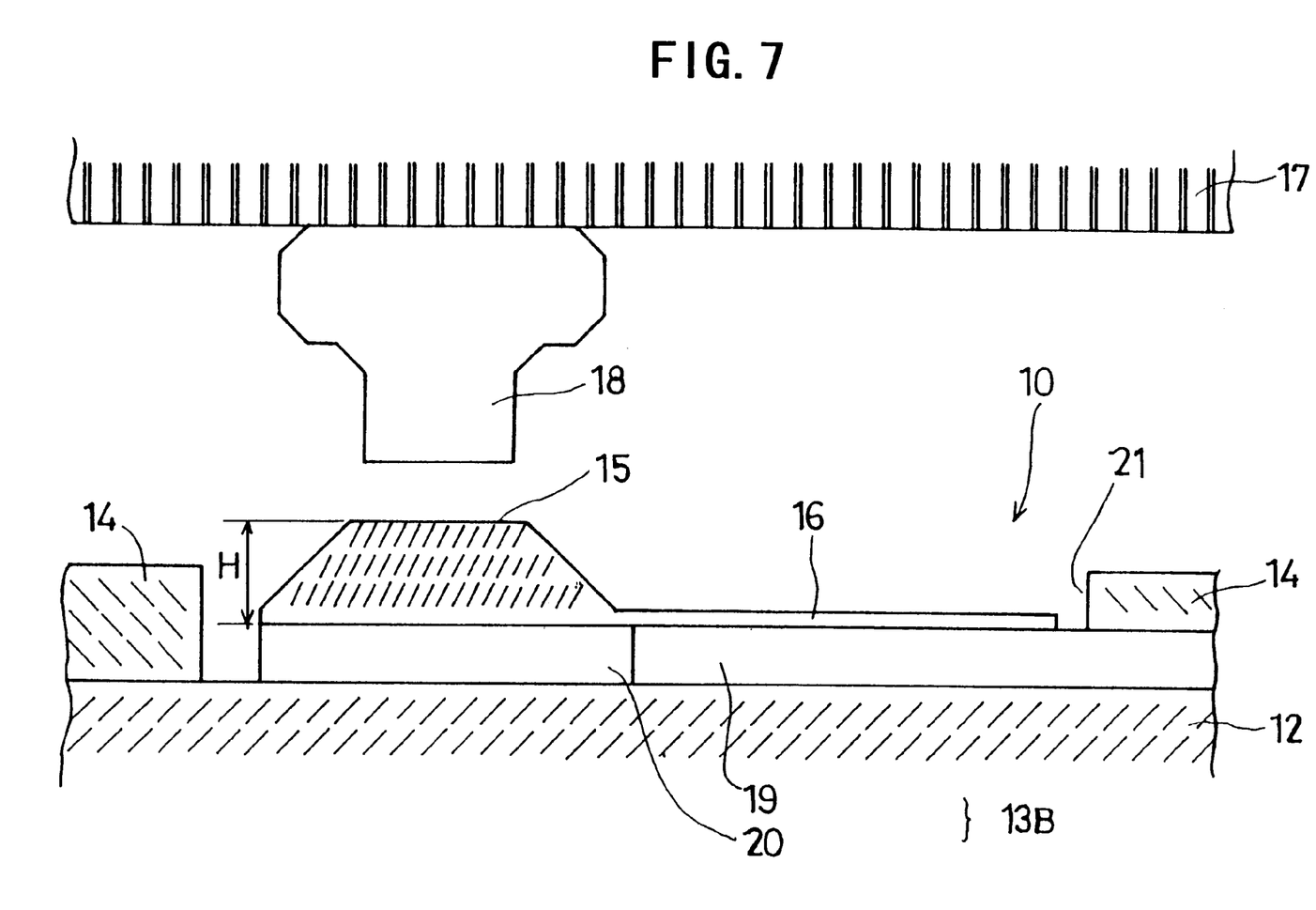
FIG. 7 is a diagram showing a positioning of a semiconductor chip to be mounted onto the flip-chip mount board of the embodiment of the present invention.
Figure 8:
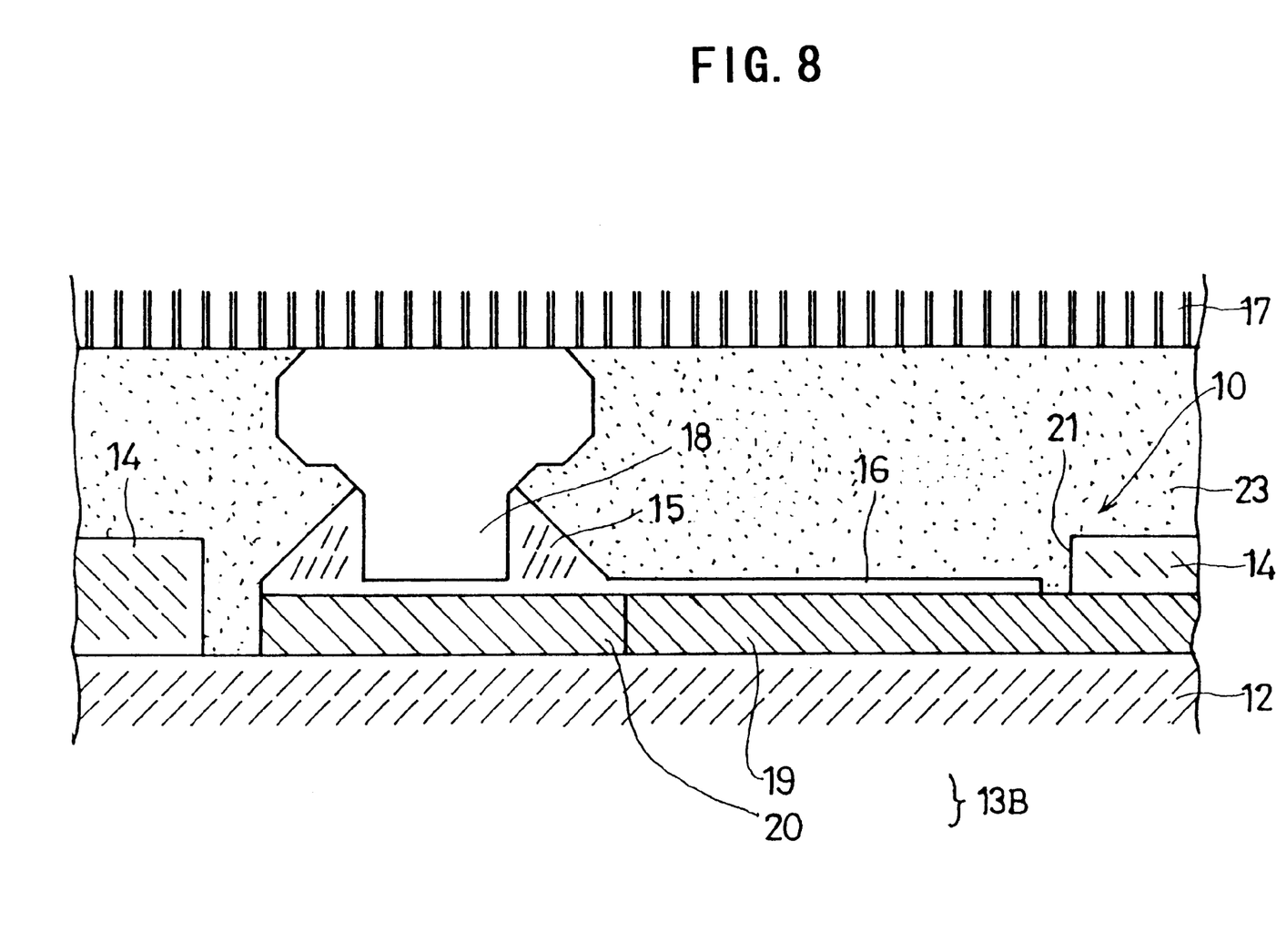
FIG. 8 is a diagram showing a mounted state of the semiconductor chip on the flip-chip mount board of the present invention.

Referring to FIGS. 7 and 8, a process of mounting the semiconductor chip 17 onto the flip-chip mount board 10 of the above-described structure will be described. FIG. 7 is a diagram showing a positioning of a semiconductor chip to be mounted onto the flip-chip mount board of the embodiment of the present invention. FIG. 8 is a diagram showing a mounted state of the semiconductor chip on the flip-chip mount board of the present invention.

The semiconductor chip 17 is provided with a plurality of bumps 18. The bumps 18 are, for example, made primarily of a material having gold (Au), and are formed by using a wire bonding technique. For example, the bumps 18 may be stud bumps formed by, first, bonding wires primarily made of gold (Au) onto electrode parts (not shown) of the semiconductor chip 17 using a wire bonding device and, then, cutting the bonded wires. Also, after formation of the stud bumps, a leveling operation may be implemented so that the height of all the bumps 18 is uniform.

Therefore, since the height of the bumps 18 is uniform even for the stud bumps, it is possible to prevent a bad connection due to the variation of the height of the bumps during the flip-chip mounting process. Therefore, a reliable flip-chip mounting can be achieved.

Also, the bumps 18 are provided on the peripheral part of the semiconductor chip 17. The semiconductor chip 17 has a high-density structure with the pitch between the bumps 18 being within the range of 70 $\mu$m to 120 $\mu$m. Thus, the above-described connection pads 20 are also provided on the peripheral part of the circuit board 12. The pitch between the connection pads 20 is also within the range of 70 $\mu$m to 120 $\mu$m, so as to correspond to the semiconductor chip 17 having the high-density structure.

Referring to FIG. 7, since the solder lumps 15 are always provided on the connection pads 20, the positions of the bumps 18 and the solder lumps 15 will always correspond when the semiconductor chip 17 is positioned facing the flip-chip mount board 10.

Therefore, when the semiconductor chip 17 is flip-chip mounted on the flip-chip mount board 10 in a face-down position, the bumps 18 will be always connected to the solder lumps 15. As shown in FIG. 8, it is possible to connect all bumps 18 to the connection pads 20 via solder (solder lumps 15). Therefore, the semiconductor chip 17 can be flip-chip mounted on the flip-chip mount board 10 with an improved reliability.

Also, as in the embodiment shown in FIG. 8, after mounting the semiconductor chip 17, an under-fill resin 23 may be provided between the semiconductor chip 17 and the flip-chip mount board 10.

With the under-fill resin 23, it is possible to prevent any breakage at the connecting part in case there is a difference in thermal expansion between the semiconductor chip 17 and the flip-chip mount board 10. Therefore, the semiconductor chip 17 can be flip-chip mounted on the flip-chip mount board 10 with a further improved reliability.

Figure 9:
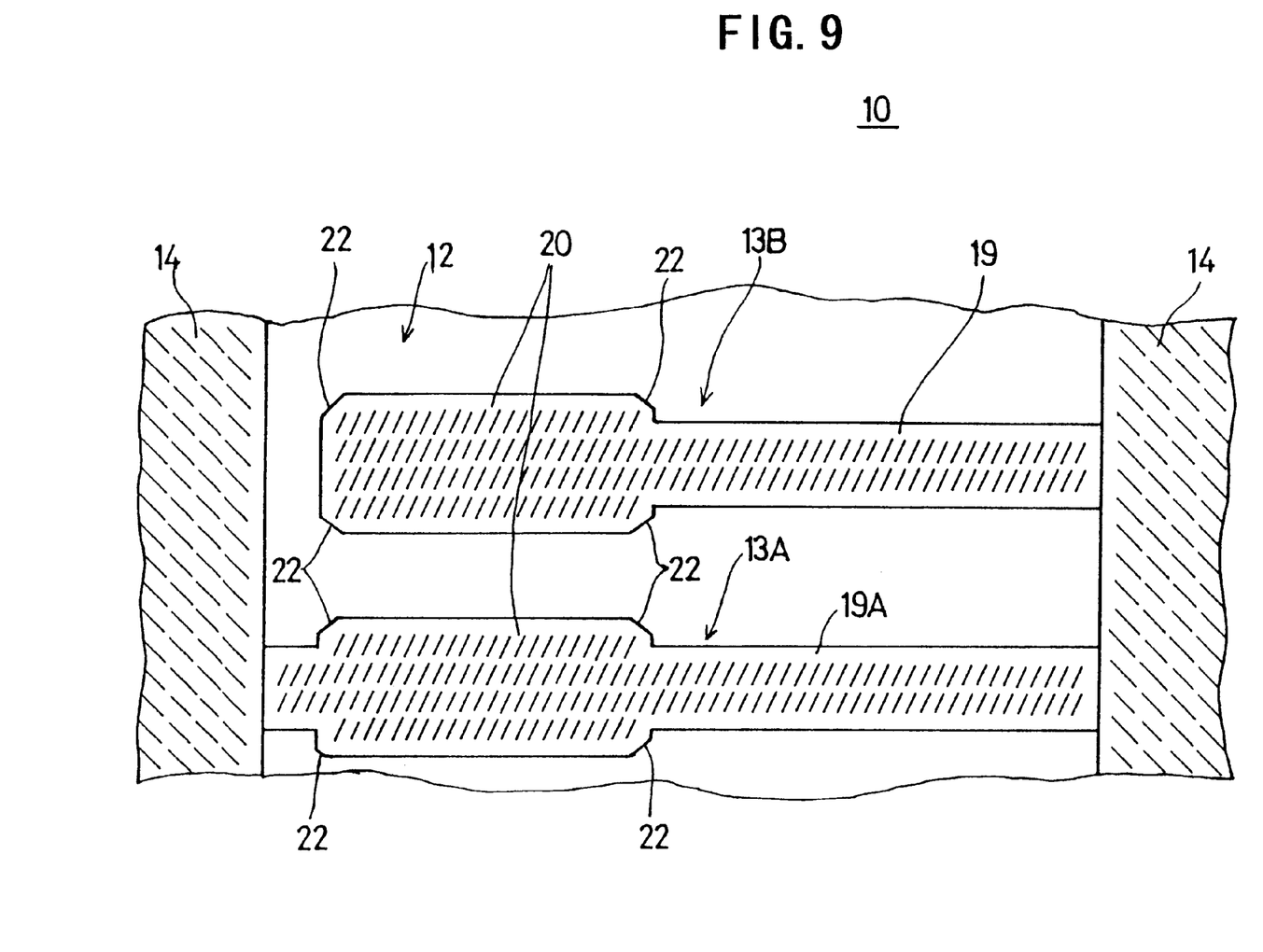
FIG. 9 is a plan view showing a part of a flip-chip mount board of a variant of the embodiment of the present invention.

FIG. 9 is a plan view showing a part of a flip-chip mount board of a variant of the embodiment of the present invention. As shown in the figure, when the connection pads 20 are patterned, the edges will not be at right angles. Instead, the edges of the connection pads 20 will be provided with beveled parts 22.

The above-described embodiment is described with the solder as the connection medium. However, the connection medium is not limited to solder, but can be any other lead-free connection medium or electrically conductive metal.

Also, the above-described embodiment is described with the semiconductor chip as the electronic component. However, the electronic component is not limited to the semiconductor chip, but can be any other electronic component having bumps or leads.

Further, the present invention is not limited to these embodiments, but variations and modifications may be made without departing from the scope of the present invention.

The present application is based on Japanese priority application No. 10-246225 filed on Aug. 31, 1998, the entire contents of which are hereby incorporated by reference.

What is claimed is:

1. A flip-chip mount board comprising a circuit board provided with a plurality of conductor patterns to which a plurality of bumps provided on an electronic component can be connected via a connection medium provided on said conductor patterns, wherein said conductor patterns further comprise at least one wiring pattern and a connection pad, said wiring pattern serving as an interconnection, said connection pad being provided at a position corresponding to one of said bumps, said at least one wiring pattern and said connection pad being integrally formed, and wherein said connection pad is formed with a width (W1) that is greater than a width (W2) of said wiring pattern (W1>W2), so that when said connection medium is fused, a lump of said connection medium is formed on said connection pad and a film of said connection medium having a thickness lower than a thickness of said lump is formed on said at least one wiring pattern.

2. The flip-chip mount board as claimed in claim 1, said connection pad having a shape of an elongated rectangle and said wiring pattern having a shape formed by a single or a plurality of rectangles, wherein, a ratio (W1/L1) between the width W1 of the connection pad and a length L1 of the connection pad satisfies the relationship:

$$0.2 \leq (W1/L1) \leq 0.5,$$

and, a ratio (W2/L2) between the width W2 of the wiring pattern and a length L2 of the wiring pattern satisfies the relationship:

$$0.1 \leq (W2/L2) \leq 2.0.$$

3. A flip-chip mount board comprising a circuit board provided with a plurality of conductor patterns to which a plurality of bumps provided on an electronic component can be connected via a connection medium provided on said conductor patterns, said conductor patterns further comprise at least one wiring pattern and a connection pad, said wiring pattern serving as an interconnection, said connection pad being provided at a position corresponding to one of said bumps, said at least one wiring pattern and said connection pad being integrally formed, and wherein said connection pad is formed with a width (W1) that is greater than a width (W2) of said wiring pattern (W1>W2), and a difference between the width (W1) of the connection pad and the width (W2) of the wiring pattern (W1/W2) is 10 to 30 $\mu$m.

4. A flip-chip mount board comprising a circuit board provided with a plurality of conductor patterns to which a plurality of bumps provided on an electronic component can be connected via a connection medium provided on said conductor patterns, said conductor patterns further comprise at least one wiring pattern and a connection pad, said wiring pattern serving as an interconnection, said connection pad being provided at a position corresponding to one of said bumps, said at least one wiring pattern and said connection pad being integrally formed, and wherein said connection pad is formed with a width (W1) that is greater than a width (W2) of said wiring pattern (W1>W2), and said connection pad is provided with beveled parts on its edges.

5. The flip-chip mount board as claimed in claim 1, wherein said connection medium is solder.

6. The flip-chip mount board as claimed in claim 1, wherein said circuit board is a printed-circuit board.

7. The flip-chip mount board as claimed in claim 1, wherein said circuit board is provided with an insulating layer except at positions contributing to the mounting of said electronic component.

8. The flip-chip mount board as claimed in claim 7, wherein said insulating layer is a solder resist.

9. A flip-chip mount board comprising a circuit board provided with a plurality of conductor patterns to which a plurality of bumps provided on an electronic component can be connected via a connection medium provided on said conductor patterns, said conductor patterns further comprise at least one wiring pattern and a connection pad, said wiring pattern serving as an interconnection, said connection pad being provided at a position corresponding to one of said bumps, said at least one wiring pattern and said connection pad being integrally formed, and wherein said connection pad is formed with a width (W1) that is greater than a width (W2) of said wiring pattern (W1>W2), and said connection pads are provided at positions corresponding to a peripheral part of said electronic component, and have a pitch between 70 μm and 120 μm.

10. The flip-chip mount board as claimed in claim 1, wherein said electronic component is a semiconductor chip.

11. The flip-chip mount board as claimed in claim 1, wherein said bumps provided on said connection pads are made primarily of a material having gold (Au).

12. A flip-chip mount board comprising a circuit board provided with a plurality of conductor patterns to which a plurality of bumps provided on an electronic component can be connected via a connection medium provided on said conductor patterns, said conductor patterns further comprise at least one wiring pattern and a connection pad, said wiring pattern serving as an interconnection, said connection pad being provided at a position corresponding to one of said bumps, said at least one wiring pattern and said connection pad being integrally formed, and wherein said connection pad is formed with a width (W1) that is greater than a width (W2) of said wiring pattern (W1>W2), and said bumps are stud bumps subjected to a leveling operation so as to have a uniform height.

13. A flip-chip mount structure comprising a flip-chip mounting board and an electronic component, said electronic component being flip-chip mounted on said flip-chip mount board in such a manner that a plurality of conductor patterns provided on a circuit board of said flip-chip mount board are connected to a plurality of bumps provided on the electronic component, respectively, via a connection medium provided on said conductor patterns, said conductor pattern further comprising at least one wiring pattern and a connection pad, said wiring pattern serving as an interconnection and said connection pad being provided at a position corresponding to one of said bumps, said at least one wiring pattern and said connection pad being integrally formed, wherein said connection pad is formed with a width (W1) that is greater than a width (W2) of said wiring pattern (W1>W2), so that when said connection medium is fused, a lump of said connection medium is formed on said connection pad and a film of said connection medium having a thickness lower than a thickness of said lump is formed on said at least one wiring pattern.

14. A flip-chip mount board for mounting electronic components, comprising:

a circuit board with a plurality of conductor patterns on which a plurality of bumps on an electronic component can be connected by a connection medium provided on said conductor patterns, said conductor patterns further comprising;

at least one wiring pattern having a first width, said wiring pattern serving as an interconnection; and a connection pad for each wiring pattern being positioned to correspond with said bumps, said connection pad having a second width that is greater than said first width.

15. A flip-chip mount board according to claim 14, wherein said at least one wiring pattern and said connection pad are integrally formed.

16. A flip-chip mount board, said flip-chip mount board comprising:

a circuit board with conductor patterns formed thereon, said conductor patterns further comprising;

at least one wiring pattern having a first width; and a connection pad having a second width that is greater than said first width, said connection pad being formed with said wiring pattern and positioned to correspond with a bump location on said electronic component to be mounted on said flip-chip mount board; and a connection medium provided on said conductor patterns through which said bumps can be connected to said connection pad.

17. A flip-chip mount board according to claim 16, wherein said wiring pattern serving as an interconnection.

18. A flip-chip mount board according to claim 16, wherein said wiring pattern and said connection pad are integrally formed.

19. A flip-chip mount board according to claim 16, wherein said connection medium further comprises a lump of said material formed on said connection pad at a position corresponding to where said bump on said electronic component will be positioned when said electronic component is mounted on said flip-chip mount board.

20. A method of manufacturing a flip-chip mount board comprising:

providing a circuit board having a plurality of conductor patterns, said conductor patterns further comprising at least one wiring pattern and a connection pad, said connection pad formed with a width (W1) that is greater that a width (W2) of said wiring pattern (W1>W2), providing a layer of connection medium on said conductor patterns; and fusing said connection medium so that a lump of said connection medium is provided on said connection pad and a film of said connection medium is provided on said at least one wiring pattern.

* * * * *